(12) United States Patent
Narushima et al.

(10) Patent No.: US 10,233,564 B2
(45) Date of Patent: Mar. 19, 2019

(54) MANUFACTURING METHOD OF MONOCRYSTALLINE SILICON AND MONOCRYSTALLINE SILICON

(71) Applicant: SUMCO CORPORATION, Tokyo (JP)

(72) Inventors: Yasuhito Narushima, Tokyo (JP); Shinichi Kawazoe, Tokyo (JP); Fukuo Ogawa, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 15/722,051

(22) Filed: Oct. 2, 2017

(65) Prior Publication Data

US 2018/0094360 A1 Apr. 5, 2018

(30) Foreign Application Priority Data

Oct. 3, 2016 (JP) .................. 2016-195403

(51) Int. Cl.
| | | |
|---|---|---|
| *C30B 15/04* | (2006.01) | |
| *C30B 15/22* | (2006.01) | |
| *C30B 15/30* | (2006.01) | |
| *C30B 29/06* | (2006.01) | |

(52) U.S. Cl.
CPC .............. *C30B 15/22* (2013.01); *C30B 15/04* (2013.01); *C30B 15/30* (2013.01); *C30B 29/06* (2013.01)

(58) Field of Classification Search
CPC .......... C30B 15/02; C30B 15/04; C30B 15/10
See application file for complete search history.

(56) References Cited

U.S. PATENT DOCUMENTS

| | | | |
|---|---|---|---|
| 4,436,577 A * | 3/1984 | Frederick | ................ C30B 29/06 117/20 |
| 7,799,130 B2 * | 9/2010 | Hong | .................... C30B 15/305 117/11 |
| 8,043,428 B2 | 10/2011 | Kawazoe et al. | |
| 8,518,180 B2 | 8/2013 | Narushima et al. | |
| 8,535,439 B2 | 9/2013 | Narushima et al. | |
| 8,871,023 B2 | 10/2014 | Takanashi et al. | |
| 8,920,561 B2 | 12/2014 | Narushima et al. | |
| 9,074,298 B2 | 7/2015 | Kawazoe et al. | |
| 2008/0286565 A1* | 11/2008 | Koike | ................... C30B 15/206 428/332 |
| 2010/0294198 A1* | 11/2010 | Wan | ...................... C30B 11/002 117/223 |
| 2011/0017948 A1 | 1/2011 | Fukuda | |
| 2015/0275392 A1* | 10/2015 | Soeta | ...................... C30B 15/22 117/19 |
| 2016/0102418 A1 | 4/2016 | Narushima et al. | |
| 2017/0029975 A1 | 2/2017 | Narushima et al. | |
| 2017/0283980 A1 | 10/2017 | Narushima et al. | |

FOREIGN PATENT DOCUMENTS

JP 2008-297167 A 12/2008

\* cited by examiner

*Primary Examiner* — Robert M Kunemund
(74) *Attorney, Agent, or Firm* — Greenblum & Bernstein, P.L.C.

(57) ABSTRACT

A smonocrystalline silicon include a straight body formed without generating a remelt growth area of 200 μm or more in a height in a growth direction. Growth striations, which are formed radially across the straight body, include a growth striation with an outer end interrupted by another growth striation not to reach a peripheral portion of the straight body. The remelt growth area has the growth striation with the interrupted outer end.

9 Claims, 6 Drawing Sheets

MANUFACTURING METHOD OF MONOCRYSTALLINE SILICON AND MONOCRYSTALLINE SILICON

The entire disclosure of Japanese Patent Application No. 2016-195403 filed Oct. 3, 2016 is expressly incorporated by reference herein.

TECHNICAL FIELD

The present invention relates to a manufacturing method of a monocrystalline silicon, and a monocrystalline silicon.

BACKGROUND ART

Monocrystalline silicons with a low electrical resistivity have recently been demanded. In a known manufacturing method of such monocrystalline silicons, according to which an n-type dopant is densely added, single crystallization is sometimes hampered, and thus studies have been conducted on prevention of such a problem (see, for instance, Patent Literature JP 2008-297167 A).

Patent Literature 1 discloses that addition of a large amount of the dopant significantly increases a freezing-point depression to cause compositional supercooling, and an abnormal growth (Cell growth), which is different from a silicon growth on a silicon growth face, is induced on a crystal growth interface when such compositional supercooling is large to hamper single crystallization.

According to the manufacturing method of Patent Literature 1, which takes into account that a temperature gradient in a silicon melt cannot be directly measured, a monocrystalline silicon is manufactured in such a manner that a predetermined relationship is satisfied between a temperature gradient of the monocrystalline silicon, which is used in place of the temperature gradient in the silicon melt, a dopant concentration in the silicon melt, a pull-up speed, and a coefficient corresponding to a dopant type.

However, dislocation sometimes occurs at an early stage of crystal growth in the process of manufacturing the monocrystalline silicon to hamper single crystallization, proving that the method of Patent Literature 1 cannot always prevent the problem.

SUMMARY OF THE INVENTION

An object of the invention is to provide a monocrystalline silicon manufacturing method capable of manufacturing a monocrystalline silicon with a stable quality, and a monocrystalline silicon.

After dedicated studies, the inventors have found the following.

Growth striations are formed inside a monocrystalline silicon. The growth striations are not in a planar shape but a curved shape in conformity with a shape of a solid-liquid interface obtained during manufacturing a monocrystalline silicon (e.g., a curved shape dented upward at a center). When a surface temperature of the silicon melt in the vicinity of the monocrystalline silicon is stable, the growth striations are substantially the same in shape.

However, a surface of the silicon melt is subjected to not only convection of the silicon melt but also factors that make the temperature unstable, such as heat extraction by purge gas and vaporization heat resulting from evaporation of the dopant. When a silicon melt with a high temperature enters the solid-liquid interface due to an unstable surface temperature of the silicon melt, the monocrystalline silicon is melted (remelted) and again hardened to generate curved growth striations that are, for instance, dented downward at a center. Consequently, as shown in FIG. 1, it has been found that a remelt growth area A is formed between a lowermost growth striation P1 of upwardly dented growth striations that spread radially across a straight body and an uppermost growth striation P2 of downwardly dented growth striations below the growth striation P1 and in a peripheral portion of the straight body of a monocrystalline silicon SM. In particular, it has been found that the remelt growth area A is formed in a shoulder-side area of the straight body.

Further, as a result of studies on a relationship between generation of the remelt growth area A and occurrence of dislocation, it has been found that generation of the remelt growth area A having a maximum value of height H (hereinafter simply referred to as "height") of 200 μm or more is accompanied by occurrence of dislocation in the straight body. In contrast, it has been found that no dislocation occurs in the straight body as a whole when the remelt growth area A having the height H of 200 μm or more is not generated.

The invention has been made in view of the above findings.

According to an aspect of the invention, a manufacturing method of a monocrystalline silicon according to a Czochralski process with use of a monocrystal pull-up apparatus, the apparatus including: a chamber; a crucible located in the chamber; a heater configured to heat the crucible to produce a dopant-added melt containing a silicon melt and a dopant added to the silicon melt; and a pull-up unit configured to pull up a seed crystal after bringing the seed crystal into contact with the dopant-added melt, the method includes forming a straight body of the monocrystalline silicon without generating a remelt growth area of 200 μm or more in a height in a growth direction, the straight body having growth striations formed radially across the straight body, the growth striations including a growth striation with an outer end interrupted by another growth striation not to reach a peripheral portion of the straight body, the remelt growth area including the growth striation with the interrupted outer end.

In the above aspect, no dislocation occurs in the straight body as a whole, so that a monocrystalline silicon with a stable quality can be manufactured.

According to another aspect of the invention, a manufacturing method of a monocrystalline silicon according to a Czochralski process with use of a monocrystal pull-up apparatus, the apparatus including: a chamber; a crucible located in the chamber; a heater configured to heat the crucible to produce a dopant-added melt including a silicon melt and red phosphorus or arsenic added as a dopant to the silicon melt; and a pull-up unit configured to pull up a seed crystal after bringing the seed crystal into contact with the dopant-added melt, the method includes forming a straight body, a target diameter of which is 200 mm or more, of the monocrystalline silicon, in which the crucible is rotated at 9 rpm or more at a start of the forming of the straight body.

Although a typical rotation speed of the crucible for the straight-body-formation step ranges from 0.1 rpm to 7 rpm, the crucible is rotated at a relatively high speed at the start of the formation of the straight body in the above aspect as described above, thereby reducing the convection of the silicon melt and, consequently, reducing variation in a temperature of the surface of the silicon melt. Such a simple adjustment of the rotation speed of the crucible can reduce remelting due to a destabilized temperature and thus reduce the generation of the remelt growth area A in the shoulder-side area (near an upper end in a pull-up direction) of the straight body. Consequently, no dislocation occurs in the straight body as a whole, so that a monocrystalline silicon with a stable quality can be manufactured.

In the above aspect, it is preferable that a rotation speed of the crucible is slowed at a predetermined timing after the start of the forming of the straight body.

When the crucible is rotated at 9 rpm throughout the straight-body-formation step, for instance, an in-plane distribution of oxygen concentration and electrical resistivity may become uneven in the straight body except an area near the upper end thereof in the pull-up direction.

In the above aspect, the rotation speed of the crucible starts being slowed at a predetermined timing after the start of the straight-body-formation step, thereby reducing not only the dislocation of the straight body as a whole but also an uneven distribution of oxygen concentration and electrical resistivity and the like.

In the above aspect, it is preferable that arsenic is used as the dopant to form the straight body with the target diameter of 300 mm and an electrical resistivity ranging from 1.6 mΩ·cm to 2.8 mΩ·cm.

In the above aspect, it is preferable that red phosphorus is used as the dopant to form the straight body with the target diameter of 300 mm and an electrical resistivity ranging from 0.7 mΩ·cm to 1.5 mΩ·cm.

In the above aspect, it is preferable that the monocrystal pull-up apparatus further includes an electromagnetic coil configured to apply a magnetic field to the dopant-added melt, and the straight body is formed while the magnetic field is applied to the dopant-added melt.

In the above aspect, the natural convection of the dopant-added melt is reduced by applying the magnetic field to the dopant-added melt, thereby enhancing a dislocation-restraining effect on the straight body as a whole.

According to still another aspect of the invention, a monocrystalline silicon including a straight body that contains arsenic as a dopant, in which growth striations are formed radially across the straight body, the growth striations including a growth striation with an outer end interrupted by another growth striation not to reach a peripheral portion of the straight body, no remelt growth area, which includes the growth striation with the interrupted outer end, with a height of 200 μm or more in a growth direction exists, a target diameter of the straight body is 200 mm, and an electrical resistivity of the straight body ranges from 1.4 mΩ·cm to 2.4 mΩ·cm.

According to yet another aspect of the invention, a monocrystalline silicon includes a straight body that contains arsenic as a dopant, in which growth striations are formed radially across the straight body, the growth striations including a growth striation with an outer end interrupted by another growth striation not to reach a peripheral portion of the straight body, no remelt growth area, which includes the growth striation with the interrupted outer end, with a height of 200 μm or more in a growth direction exists, a target diameter of the straight body is 300 mm, and an electrical resistivity of the straight body ranges from 1.6 mΩ·cm to 2.8 mΩ·cm.

According to a further aspect of the invention, a monocrystalline silicon includes a straight body that contains red phosphorus as a dopant, in which growth striations are formed radially across the straight body, the growth striations including a growth striation with an outer end interrupted by another growth striation not to reach a peripheral portion of the straight body, no remelt growth area, which includes the growth striation with the interrupted outer end, with a height of 200 μm or more in a growth direction exists, a target diameter of the straight body is 200 mm, and an electrical resistivity of the straight body ranges from 0.6 mΩ·cm to 1.2 mΩ·cm.

According to a still further aspect of the invention, a monocrystalline silicon includes a straight body that contains red phosphorus as a dopant, in which growth striations are formed radially across the straight body, the growth striations including a growth striation with an outer end interrupted by another growth striation not to reach a peripheral portion of the straight body, no remelt growth area, which includes the growth striation with the interrupted outer end, with a height of 200 μm or more in a growth direction exists, a target diameter of the straight body is 300 mm, and an electrical resistivity of the straight body ranges from 0.7 mΩ·cm to 1.5 mΩ·cm.

BRIEF DESCRIPTION OF DRAWING(S)

FIG. 1 schematically shows a structure of a remelt growth area.

FIG. 2 schematically shows an arrangement of a monocrystal pull-up apparatus according to an exemplary embodiment of the invention.

DESCRIPTION OF EMBODIMENT(S)

Exemplary Embodiment(s)

Figure 2:
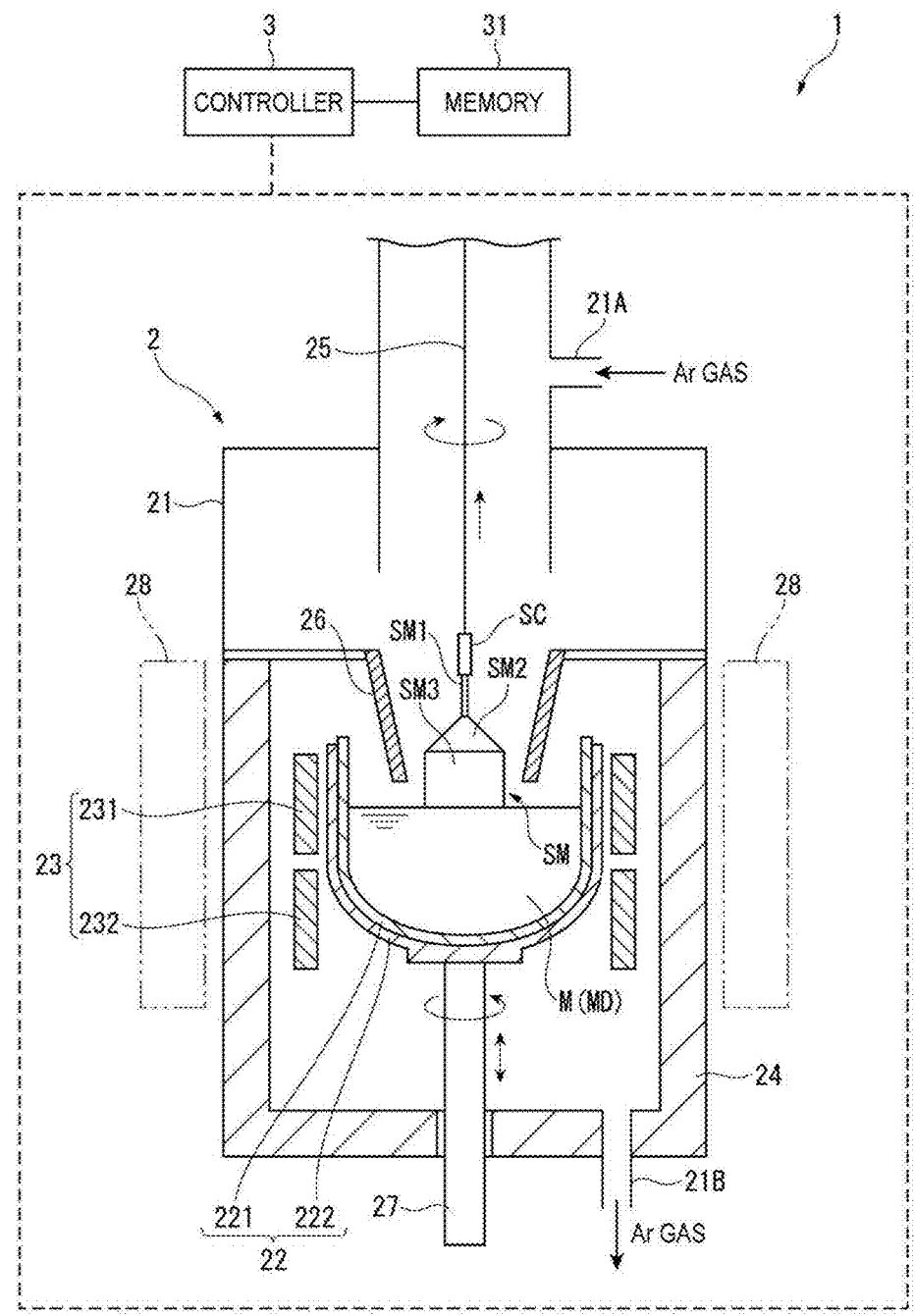

An Exemplary embodiment of the invention will be described below with reference to the attached drawings.
Arrangement of Monocrystal Pull-Up Apparatus As shown in FIG. 2, a monocrystal pull-up apparatus 1 is an apparatus usable for the CZ (Czochralski) process and includes a pull-up apparatus body 2 and a controller 3.

The pull-up apparatus body 2 includes a chamber 21, a crucible 22 located at a center in the chamber 21, a heater 23 for heating the crucible 22, a heat insulating cylinder 24, a pull-up cable 25 serving as a pull-up unit, and a heat shield 26.

A gas inlet 21A through which an inert gas (e.g. Ar gas) is introduced into the chamber 21 is provided at an upper part of the chamber 21. A gas outlet 21B through which the gas in the chamber 21 is discharged when a vacuum pump (not shown) is driven is provided at a lower part of the chamber 21.

The inert gas is introduced at a predetermined gas flow rate into the chamber 21 through the gas inlet 21A at the upper part of the chamber 21 under the control of the controller 3. The introduced gas is then discharged through the gas outlet 21B at the lower part of the chamber 21 after flowing inside the chamber 21 from the upper side toward the lower side.

A pressure (furnace pressure) inside the chamber 21 is to be controlled by the controller 3.

The crucible 22 is configured to melt polycrystalline silicon (i.e. a material of a silicon wafer) to provide a silicon melt M. The crucible 22 is supported by a support shaft 27 rotatable at a predetermined speed and vertically movable. The crucible 22 includes a cylindrical quartz crucible 221 with a closed bottom and a support crucible 222 made of a carbon material that houses the quartz crucible 221.

The heater 23 is located in the vicinity of the crucible 22 to melt the silicon inside the crucible 22. The heater 23 includes an upper heater 231 for heating an upper side surface of the crucible 22 and a lower heater 232, which is located below the upper heater 231, for heating a lower side surface of the crucible 22.

The heat insulating cylinder 24 is located around the crucible 22 and the heater 23.

The pull-up cable 25 has a first end connected to a pull-up driver (not shown) located above the crucible 22 and a second end attached with a seed crystal SC. The pull-up cable 25 is vertically movable at a predetermined speed and rotatable around an axis of the pull-up cable 25 under the control by the controller 3.

The heat shield 26 is configured to block radiant heat radiated upward from the heater 23.

The controller 3 is configured to control, for instance, the gas flow rate and the furnace pressure in the chamber 21, the temperature of heat applied to the crucible 22 by the heater 23 and the respective rotation speeds of the crucible 22 and the monocrystalline silicon SM based on information stored in a memory 31, an input by an operator or the like to manufacture the monocrystalline silicon SM.

Manufacturing Method of Monocrystalline Silicon

Next, description will be made on a manufacturing method of the monocrystalline silicon SM.

It should be noted that the straight body of the monocrystalline silicon SM to be manufactured exemplarily has a target diameter R of 200 mm in the exemplary embodiment, but the monocrystalline silicon SM with any different target diameter such as 300 mm and 450 mm may be manufactured.

First, the controller 3 of the monocrystal pull-up apparatus 1 sets manufacturing conditions for the monocrystalline silicon SM, such as electrical resistivity, oxygen concentration, Ar flow rate, furnace pressure, respective rotation speeds of the crucible 22 and the monocrystalline silicon SM, and a heating ratio between the upper heater 231 and the lower heater 232. The manufacturing conditions may be inputted by an operator or calculated by the controller 3 based on, for instance, a target oxygen concentration inputted by an operator.

The electrical resistivity preferably ranges from 1.4 mΩ·cm to 2.4 mΩ·cm in the use of arsenic as the dopant and preferably from 0.6 mΩ·cm to 1.2 mΩ·cm in the use of red phosphorus as the dopant.

Incidentally, when the target diameter R of the straight body is 300 mm, the electrical resistivity preferably ranges from 1.6 mΩ·cm to 2.8 mΩ·cm in the use of arsenic as the dopant and preferably ranges from 0.7 mΩ·cm to 1.5 mΩ·cm in the use of red phosphorus as the dopant.

Further, the heating ratio is set at 1, which means that a heating volume for the upper portion of the crucible 22 is the same as a heating volume for the lower portion, throughout the entire manufacturing process of the monocrystalline silicon SM in the exemplary embodiment, but may be set at any value in a range from 1 to 4. When the heating ratio is less than 1, that is, the heating volume for the lower portion is smaller than the heating volume for the upper portion, a convection from the bottom of the crucible 22 toward or below a solid-liquid interface cannot become strong enough to weaken a convection with an unstable liquid temperature from a surface of a dopant-added melt MD toward a crystal, and thus dislocation due to a destabilized temperature cannot be reduced. In contrast, when the heating ratio is more than 4, a large heat load on the lower portion of the crucible 22 may cause deformation of the crucible 22 and/or peeling of quartz.

Next, the controller 3 controls the upper heater 231 and the lower heater 232 based on the set value of the heating ratio to heat the crucible 22, thereby melting the polycrystalline silicon material (silicon material) and the dopant in the crucible 22 to produce the dopant-added melt MD. The controller 3 then performs a process to introduce an Ar gas at a predetermined flow rate into the chamber 21 through the gas inlet 21A and reduce the pressure in the chamber 21 so that an inert atmosphere under the reduced pressure is kept in the chamber 21.

The controller 3 then performs a neck-formation step, a shoulder-formation step, a straight-body-formation step and a tail-formation step.

In the neck-formation step, the controller 3 moves the pull-up cable 25 downward to immerse the seed crystal SC into the dopant-added melt MD, and pulls up the pull-up cable 25 while rotating the crucible 22 and the pull-up cable 25 in a predetermined direction, thereby forming a neck SM1. It should be noted that the rotation speed of the crucible 22 in the neck-formation step is preferably the same as one at the beginning of the shoulder-formation step.

In the shoulder-formation step, the pull-up cable 25 is further pulled up to form a shoulder SM2. It should be noted that the rotation speed of the crucible 22 at the end of the shoulder-formation step is preferably the same as one at the start of the straight-body-formation step.

Figure 1:
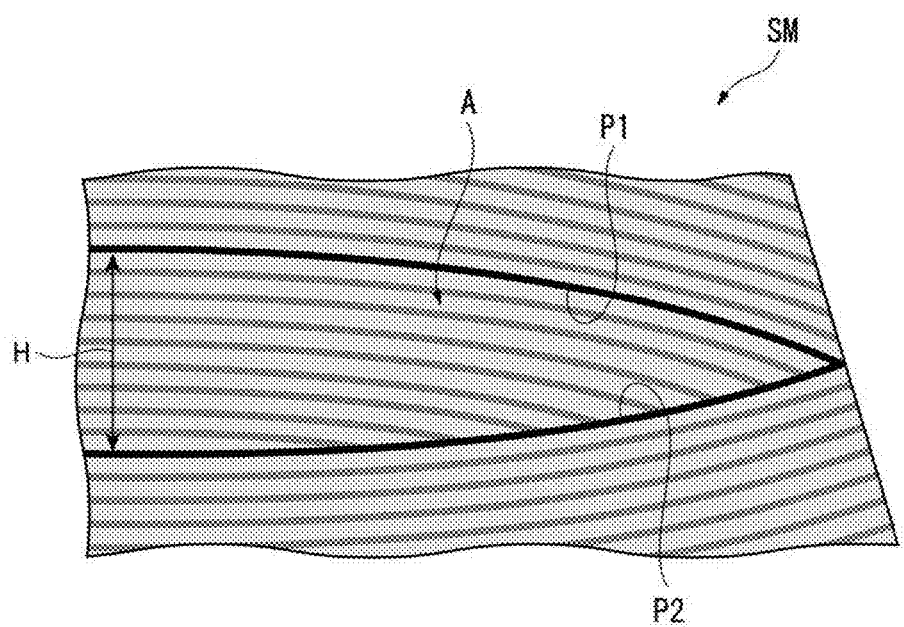
Figure 3:
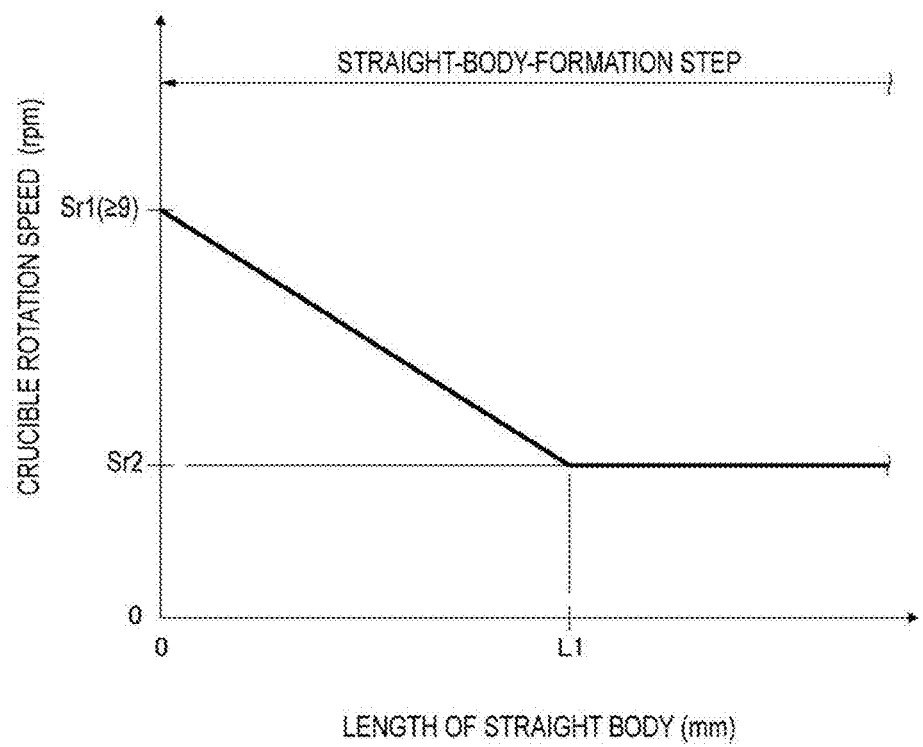
FIG. 3 shows manufacturing conditions according to the exemplary embodiment.
Figure 4:
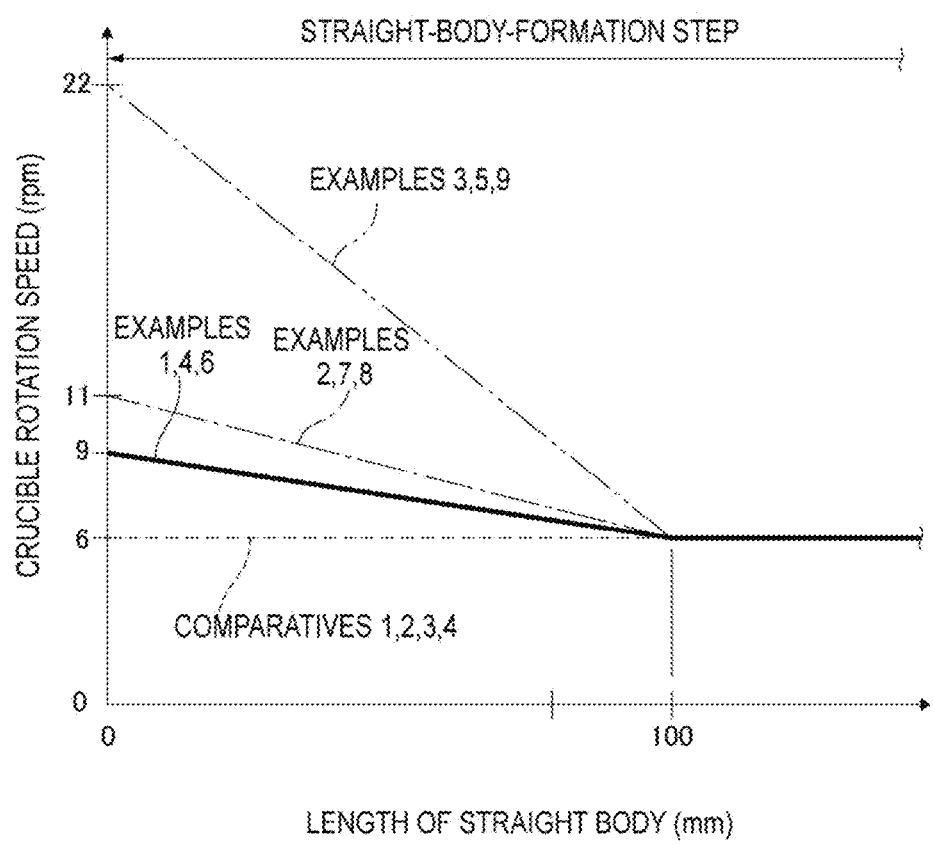
FIG. 4 shows manufacturing conditions of Experiment 1 in Examples according to the invention.

In the straight-body-formation step, a straight body SM3 is formed in such a manner not to generate the remelt growth area A having the height H of 200 μm or more as shown in FIG. 1. Specifically, as shown in FIG. 3, the controller 3 pulls up the pull-up cable 25 while rotating the crucible 22 at a rotation speed Sr1 (Sr1≥9 rpm). Sr1 is required to be at least 9 rpm but preferably 30 rpm or less. This is because Sr1 exceeding 30 rpm destabilizes the operation of the monocrystal pull-up apparatus 1 to cause deformation of the straight body SM3. It should be noted that an abscissa axis in each of FIGS. 3 and 4 represents a length of the straight body SM3, and a 0-mm position in length corresponds to an upper end of the straight body SM3.

The rotation speed then starts being gradually slowed immediately upon the start of the straight-body-formation step. Specifically, the rotation speed is linearly slowed such that the rotation speed reaches Sr2, which is suitable for forming the straight body, at a length L1 of the straight body SM3.

The rotation speed is then kept at Sr2 and the formation of the straight body SM3 is continued. After the completion of the straight-body-formation step, the tail-formation step is performed and thus manufacturing of the monocrystalline silicon SM is completed.

It should be noted that L1 preferably ranges from 50 mm to 200 mm. L1 of less than 50 mm results in an increase in a process (i.e., rotation speed) variation, which may increase the risk of dislocation. In contrast, L1 exceeding 200 mm results in an increase of a section where a target process or rotation speed for the straight body is not reached, which may increase the risk of failing to obtain a product with a desired quality.

Further, Sr2 preferably ranges from 0.1 rpm to 7 rpm. This is because Sr2 of less than 0.1 rpm destabilizes the dopant-added melt MD to cause dislocation and Sr2 exceeding 7 rpm increases variations in an in-plane distribution of oxygen concentration and electrical resistivity in the monocrystalline silicon SM to destabilize a crystal quality.

Advantage(s) of Exemplary Embodiment(s)

In the exemplary embodiment, the straight-body-formation step is performed in such a manner not to generate the remelt growth area A having the height H of 200 μm or more in the straight body SM3, thereby reducing occurrence of dislocation of the straight body SM3 as a whole. The monocrystalline silicon SM with a stable quality can thus be manufactured.

Further, the monocrystalline silicon with less dislocation can be manufactured simply by rotating the crucible 22 at a rotation speed of 9 rpm or more at the start of the straight-body-formation step.

Additionally, the rotation speed starts being gradually slowed at the predetermined timing after the straight-body-formation step, thereby reducing not only the dislocation of the straight body but also an uneven distribution of oxygen concentration and electrical resistivity and the like.

Modification(s)

It should be understood that the scope of the invention is not limited by the above exemplary embodiment, but various improvements and modifications are possible as long as the improvements and modifications are compatible with the invention and, further, specific processes, arrangements and the like in the practice of the invention may be changed as long as an object of the invention is achievable.

For instance, the monocrystalline silicon SM may be manufactured through the same process as in the exemplary embodiment according to an MCZ (magnecti field applied Czochralski) process irrespective of the target diameter R of the straight body. In such a case, a pair of electromagnetic coils 28 may be located outside the chamber 21 and opposite to each other across the crucible 22 as shown by chain double-dashed lines in FIG. 2 so that the natural convection of the silicon melt M can be reduced by a horizontal traverse magnetic field. The magnetic flux density preferably ranges from 0.1 T to 0.4 T in the use of the MCZ process. When a magnetic flux density is less than 0.1 T, an effect in reducing the convection of the silicon melt M is lowered to make application of the magnetic field ineffective. When a magnetic flux density exceeds 0.4 T, a magnetic field with such a large magnetic flux density is unlikely to be applicable in consideration of the allowable limit of the apparatus.

Although the rotation speed starts being gradually slowed immediately upon the start of the straight-body-formation step, the rotation speed may be kept at Sr1 for a predetermined period after the start of the straight-body-formation step and then start being gradually slowed.

The rotation speed of the crucible 22 is exemplarily slowed in a linearly reduced manner but may be reduced in a different manner. For instance, the rotation speed may be reduced in a non-linear or stepwise manner.

EXAMPLE(S)

Next, the invention will be described in more detail below with reference to Examples. However, it should be noted that the scope of the invention is by no means limited by these Examples.

Experiment 1

Relationship Between Rotation Speed of Crucible and Dislocation Manufacturing Method of Monocrystalline Silicon Comparative 1, Examples 1 to 3

In Comparative 1, after the shoulder-formation step, the cable was pulled up while the crucible was rotated at 6 rpm throughout the entire straight-body-formation step to form a straight body as shown in FIG. 4 and Table 1. Subsequently, the tail-formation step was performed.

In Example 1, the cable was pulled up while the crucible was rotated at 9 rpm at the start of the straight-body-formation step, and then the rotation speed was gradually slowed to become 6 rpm when the length of a straight body reached 100 mm. The rotation speed was then kept at 6 rpm until the straight-body-formation step was completed, and the tail-formation step was performed under the same conditions as in Comparative 1.

In Examples 2 and 3, monocrystalline silicons were manufactured under the same conditions as in Example 1 except that the crucible was rotated respectively at 11 rpm and 22 rpm during the period when the crucible was rotated at 9 rpm in Example 1.

It should be noted that the shoulder-formation step was performed such that the rotation speed at the end of the shoulder-formation step became the same as the rotation speed at the start of the straight-body-formation step (i.e., 6 rpm, 9 rpm, 11 rpm and 22 rpm respectively in Comparative 1 and Examples 1, 2 and 3).

The monocrystalline silicons manufactured in Comparative 1 and Examples 1 to 3 were each observed to find whether or not dislocation occurred in the straight body.

Table 1 shows the target diameter of the straight body, the dopant, the frequency of pulling up ('try' frequency), a target electrical resistivity at the upper end of the straight body at each trial (target resistivity at each try), the frequency of occurrence of dislocation (dislocation frequency), the incidence of dislocation (dislocation rate=dislocation frequency/try frequency).

TABLE 1

| | | Comp. 1 | Ex. 1 | Ex. 2 | Ex. 3 |
|---|---|---|---|---|---|
| Target Diameter of Straight Body | | 200 mm | | | |
| Dopant | | Arsenic | | | |
| Rotation Speed of Crucible (rpm) | | 6→6 | 9→46 | 11→46 | 22→46 |
| Try Frequency | | 5 | 4 | 2 | 3 |
| Target Resistivity (mΩ · cm) | Try 1 | 2.0 | 2.4 | 2.1 | 2.0 |
| | Try 2 | 1.8 | 1.8 | 1.6 | 2.1 |
| | Try 3 | 2.4 | 2.0 | — | 1.4 |
| | Try 4 | 2.1 | 2.3 | — | — |
| | Try 5 | 2.2 | — | — | — |
| Dislocation Frequency | | 4 | 0 | 0 | 0 |
| Dislocation Rate | | 80% | 0% | 0% | 0% |

Comparatives 2 to 4, Examples 4 to 9

A monocrystalline silicon was manufactured in Comparative 2 under the same conditions as in Comparative 1 except that red phosphorus was used as the dopant as shown in FIG. 4 and Table 2.

Monocrystalline silicons were manufactured in Comparatives 3 and 4 under the same conditions respectively as in Comparatives 1 and 2 except that the target diameter of the straight body was 300 mm as shown in FIG. 4 and Tables 3 and 4.

Monocrystalline silicons were manufactured in Examples 4 and 5 under the same conditions as in Comparative 2 except that the rotation speeds of the crucible were the same respectively as in Examples 1 and 3.

Monocrystalline silicons were manufactured in Examples 6 and 7 under the same conditions as in Comparative 3 except that the rotation speeds of the crucible were the same respectively as in Examples 1 and 2.

Monocrystalline silicons were manufactured in Examples 8 and 9 under the same conditions as in Comparative 4 except that the rotation speeds of the crucible were the same respectively as in Examples 2 and 3.

The try frequency, a target resistivity at each try, the dislocation frequency and the dislocation incidence of each of Comparatives 2 to 4 and Examples 4 to 9 are shown in Tables 2 to 4.

TABLE 2

|  |  | Comp. 2 | Ex. 4 | Ex. 5 |
|---|---|---|---|---|
| Target Diameter of Straight Body |  | 200 mm | | |
| Dopant |  | Red Phosphorus | | |
| Rotation Speed of Crucible (rpm) |  | 6→6 | 9→6 | 22→6 |
| Try Frequency |  | 3 | 2 | 2 |
| Target Resistivity (mΩ·cm) | Try 1 | 1.0 | 1.2 | 0.9 |
|  | Try 2 | 0.9 | 0.7 | 0.6 |
|  | Try 3 | 0.8 | — | — |
| Dislocation Frequency |  | 2 | 0 | 0 |
| Dislocation Rate |  | 67% | 0% | 0% |

TABLE 3

|  |  | Comp. 3 | Ex. 6 | Ex. 7 |
|---|---|---|---|---|
| Target Diameter of Straight Body |  | 300 mm | | |
| Dopant |  | Arsenic | | |
| Rotation Speed of Crucible (rpm) |  | 6→6 | 9→6 | 11→6 |
| Try Frequency |  | 4 | 4 | 3 |
| Target Resistivity (mΩ·cm) | Try 1 | 2.3 | 2.8 | 2.2 |
|  | Try 2 | 2.6 | 2.2 | 2.0 |
|  | Try 3 | 2.0 | 1.8 | 1.6 |
|  | Try 4 | 2.2 | 2.2 | — |
| Dislocation Frequency |  | 3 | 0 | 0 |
| Dislocation Rate |  | 75% | 0% | 0% |

TABLE 4

|  |  | Comp. 4 | Ex. 8 | Ex. 9 |
|---|---|---|---|---|
| Target Diameter of Straight Body |  | 300 mm | | |
| Dopant |  | Red Phosphorus | | |
| Rotation Speed of Crucible (rpm) |  | 6→6 | 11→6 | 22→6 |
| Try Frequency |  | 3 | 4 | 2 |
| Target Resistivity (mΩ·cm) | Try 1 | 1.3 | 1.5 | 1.0 |
|  | Try 2 | 1.0 | 0.8 | 0.7 |
|  | Try 3 | 1.1 | 1.0 | — |
|  | Try 4 | — | 1.2 | — |
| Dislocation Frequency |  | 2 | 0 | 0 |
| Dislocation Rate |  | 67% | 0% | 0% |

Evaluation

As shown in Tables 1 to 4, dislocation sometimes occurred in the monocrystalline silicons in Comparatives 1 to 4, but no dislocation occurred in any portion in Examples 1 to 9. It has thus been proven that a monocrystalline silicon with no dislocation occurring in the straight body as a whole can be manufactured by rotating the crucible at 9 rpm or more at the start of the formation of the straight body.

It has also been proven from the results shown in Tables 1 and 2 that a target electrical resistivity at the upper end of the straight body for manufacturing a monocrystalline silicon with the target diameter of the straight body being 200 mm should be set in a range from 1.4 mΩ·cm to 2.4 mΩ·cm in the use of arsenic as the dopant and in a range from 0.6 mΩ·cm to 1.2 mΩ·cm in the use of red phosphorus.

Further, it has been proven from the results shown in Tables 3 and 4 that a target electrical resistivity for manufacturing a monocrystalline silicon with the target diameter of the straight body being 300 mm should be set in a range from 1.6 mΩ·cm to 2.8 mΩ·cm in the use of arsenic as the dopant and in a range from 0.7 mΩ·cm to 1.5 mΩ·cm in the use of red phosphorus.

Experiment 2

Relationship Between Dislocation and Height of Remelt Growth Area

Figure 5:
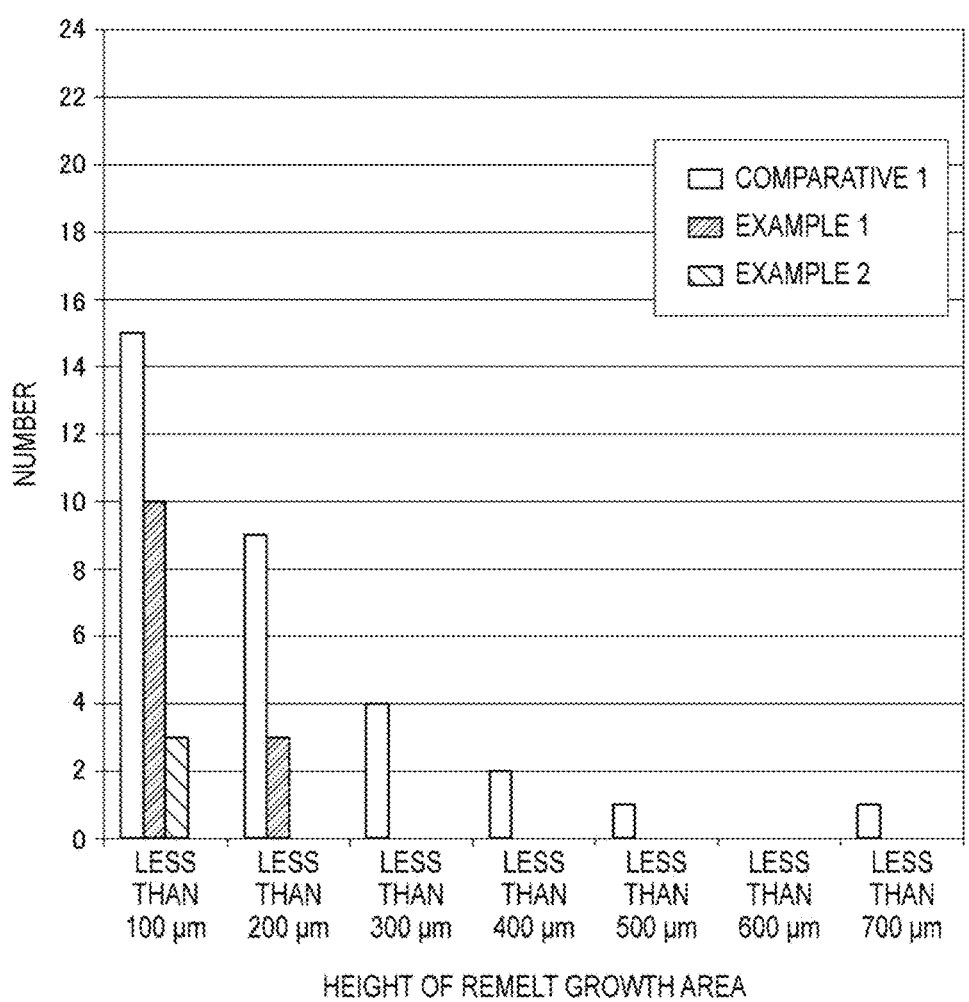
FIG. 5 is a graph of a relationship between the height and the number of the remelt growth area(s) of Experiment 2 in Examples, showing the results of Comparative 1 and Examples 1 and 2.

The monocrystalline silicons of Comparatives 1 and 3, in which dislocation occurred, were each vertically cut at a center in a radial direction, and the obtained cross section of the straight body was observed on X-rays to evaluate the number and the height of the remelt growth area(s). The same evaluation was also performed on the monocrystalline silicons of Examples 1, 2 and 6 in which no dislocation occurred. FIG. 5 shows the results of Comparative 1 and Examples 1 and 2 and FIG. 6 shows the results of Comparative 3 and Example 6.

Figure 6:
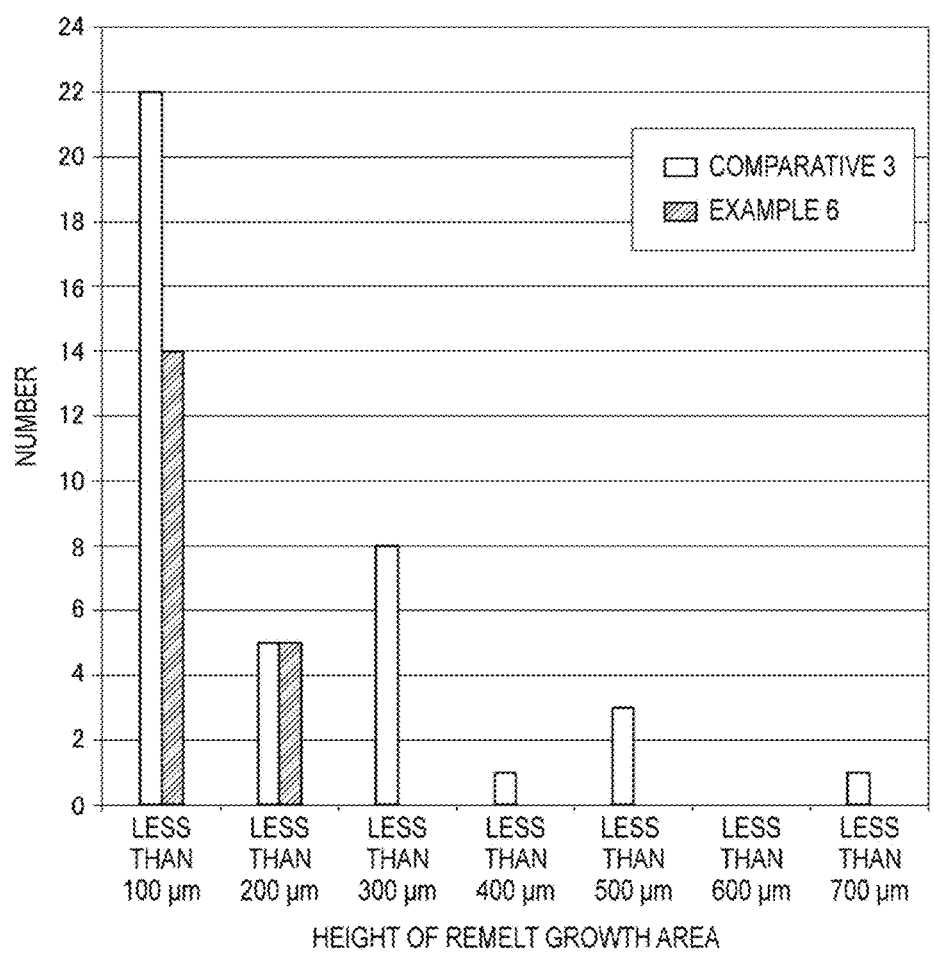
FIG. 6 is a graph of a relationship between the height and the number of the remelt growth area(s) of Experiment 2, showing the results of Comparative 3 and Example 6.

As shown in FIGS. 5 and 6, the straight body of each of Examples 1, 2 and 6 had remelt growth areas of less than 200 μm in height but no remelt growth area of 200 μm or more. In contrast, the straight body of each of Comparatives 1 and 3 had not only remelt growth areas of less than 200 μm but also ones of 200 μm or more. Further, since no dislocation occurred in the monocrystalline silicons of Examples 3 to 5 and 7 to 9, the straight bodies thereof can be supposed to have no remelt growth area of 200 μm or more in height. Additionally, since dislocation occurred in the monocrystalline silicon of Comparative 2, the straight body thereof can be supposed to have a remelt growth area(s) of 200 μm or more in height.

In view of the above, it have been proven that a dislocation-free monocrystalline silicon can be manufactured by performing the straight-body-formation step in a manner not to generate a remelt growth area of 200 μm or more in height in the straight body.

What is claimed is:

1. A manufacturing method of a monocrystalline silicon according to a Czochralski process with use of a monocrystal pull-up apparatus, the apparatus comprising:
   a chamber;
   a crucible located in the chamber;
   a heater configured to heat the crucible to produce a dopant-added melt comprising a silicon melt and a dopant added to the silicon melt; and a pull-up unit configured to pull up a seed crystal after bringing the seed crystal into contact with the dopant-added melt, the method comprising forming a straight body of the monocrystalline silicon without generating a remelt growth area of 200 μm or more in a height in a growth direction, the straight body having growth striations formed radially across the straight body, the growth striations comprising a growth striation with an outer end interrupted by another growth striation not to reach a peripheral portion of the straight body, the remelt growth area comprising the growth striation with the interrupted outer end.

2. A manufacturing method of a monocrystalline silicon according to a Czochralski process with use of a monocrystal pull-up apparatus, the apparatus comprising:
   a chamber;
   a crucible located in the chamber;
   a heater configured to heat the crucible to produce a dopant-added melt comprising a silicon melt and red phosphorus or arsenic added as a dopant to the silicon melt; and
   a pull-up unit configured to pull up a seed crystal after bringing the seed crystal into contact with the dopant-added melt, the method comprising forming a straight body, a target diameter of which is 200 mm or more, of the monocrystalline silicon,
   wherein:
      the crucible is rotated at 9 rpm or more at a start of the forming of the straight body, and
      a rotation speed of the crucible is slowed at a predetermined timing after the start of the forming of the straight body.

3. The manufacturing method according to claim 2, wherein arsenic is used as the dopant to form the straight body with the target diameter of 300 mm and an electrical resistivity ranging from 1.6 mΩ·cm to 2.8 mΩ·cm.

4. The manufacturing method according to claim 2, wherein red phosphorus is used as the dopant to form the straight body with the target diameter of 300 mm and an electrical resistivity ranging from 0.7 mΩ·cm to 1.5 mΩ·cm.

5. The manufacturing method according to claim 2, wherein
   the monocrystal pull-up apparatus further comprises an electromagnetic coil configured to apply a magnetic field to the dopant-added melt, and
   the straight body is formed while the magnetic field is applied to the dopant-added melt.

6. A monocrystalline silicon comprising a straight body that comprises arsenic as a dopant, wherein
   growth striations are formed radially across the straight body, the growth striations comprising a growth striation with an outer end interrupted by another growth striation not to reach a peripheral portion of the straight body,
   no remelt growth area, which comprises the growth striation with the interrupted outer end, with a height of 200 μm or more in a growth direction exists,
   a target diameter of the straight body is 200 mm, and
   an electrical resistivity of the straight body ranges from 1.4 mΩ·cm to 2.4 mΩ·cm.

7. A monocrystalline silicon comprising a straight body that comprises arsenic as a dopant, wherein
   growth striations are formed radially across the straight body, the growth striations comprising a growth striation with an outer end interrupted by another growth striation not to reach a peripheral portion of the straight body,
   no remelt growth area, which comprises the growth striation with the interrupted outer end, with a height of 200 Ωm or more in a growth direction exists,
   a target diameter of the straight body is 300 mm, and
   an electrical resistivity of the straight body ranges from 1.6 mΩ·cm to 2.8 mΩ·cm.

8. A monocrystalline silicon comprising a straight body that comprises red phosphorus as a dopant, wherein
   growth striations are formed radially across the straight body, the growth striations comprising a growth striation with an outer end interrupted by another growth striation not to reach a peripheral portion of the straight body,
   no remelt growth area, which comprises the growth striation with the interrupted outer end, with a height of 200 μm or more in a growth direction exists,
   a target diameter of the straight body is 200 mm, and
   an electrical resistivity of the straight body ranges from 0.6 mΩ·cm to 1.2 mΩ·cm.

9. A monocrystalline silicon comprising a straight body that comprises red phosphorus as a dopant, wherein
   growth striations are formed radially across the straight body, the growth striations comprising a growth striation with an outer end interrupted by another growth striation not to reach a peripheral portion of the straight body,
   no remelt growth area, which comprises the growth striation with the interrupted outer end, with a height of 200 μm or more in a growth direction exists,
   a target diameter of the straight body is 300 mm, and
   an electrical resistivity of the straight body ranges from 0.7 mΩ·cm to 1.5 mΩ·cm.

* * * * *